US008198569B2

United States Patent
Krobok et al.

(10) Patent No.: US 8,198,569 B2
(45) Date of Patent: Jun. 12, 2012

(54) ELECTRICALLY CONDUCTIVE TEXTILE

(75) Inventors: Martin Krobok, Aichach (DE); Markus Voelk, Poecking (DE); Peter Bramberger, Welshofen (DE)

(73) Assignee: W.E.T. Automotive System AG, Odelzhausen (DE)

( * ) Notice: Subject to any disclaimer, the term of this patent is extended or adjusted under 35 U.S.C. 154(b) by 1140 days.

(21) Appl. No.: 11/189,369

(22) Filed: Jul. 26, 2005

(65) Prior Publication Data

US 2006/0027552 A1 Feb. 9, 2006

(30) Foreign Application Priority Data

Jul. 28, 2004 (DE) .................. 10 2004 036 633
Jun. 23, 2005 (DE) .................. 10 2005 029 617

(51) Int. Cl.
*H05B 3/02* (2006.01)
*H05B 1/00* (2006.01)
(52) U.S. Cl. ........................ 219/546; 219/217
(58) Field of Classification Search .................. 219/549, 219/550, 538, 547, 212, 217, 218, 24, 202
See application file for complete search history.

(56) References Cited

U.S. PATENT DOCUMENTS

| | | | | |
|---|---|---|---|---|
| 4,065,848 A * | 1/1978 | Dery | ................................ | 29/611 |
| 4,244,774 A * | 1/1981 | Dery | ............................ | 156/574 |
| 4,721,845 A * | 1/1988 | Kunert et al. | ................. | 219/203 |
| 4,795,379 A * | 1/1989 | Sasaki et al. | .................. | 439/856 |
| 4,954,670 A * | 9/1990 | Jensen et al. | .................... | 174/92 |
| 5,413,672 A * | 5/1995 | Hirotsuji et al. | ................ | 216/87 |
| 5,904,903 A * | 5/1999 | Hotz et al. | .................... | 422/174 |
| 2004/0094534 A1 * | 5/2004 | Howick et al. | ................. | 219/529 |

FOREIGN PATENT DOCUMENTS

DE 199 26 379 12/2000
WO WO 2004/095986 A1 11/2004

* cited by examiner

*Primary Examiner* — Daniel L Robinson
(74) *Attorney, Agent, or Firm* — Dobrusin & Thennisch PC

(57) ABSTRACT

A surface structure (1) that is at least partially electrically conductively coated by a conductor coating (11), and which can be connected to an electric power source by at least one electric connecting conductor (2). The connecting conductor (2) electrically contacts the conductor coating (11) at at least one solder point (3), and the conductive coating (11) is thickened at least at one contact zone (4) in the area of the solder point (3) as opposed to other areas (7) of the surface structure (1).

19 Claims, 2 Drawing Sheets

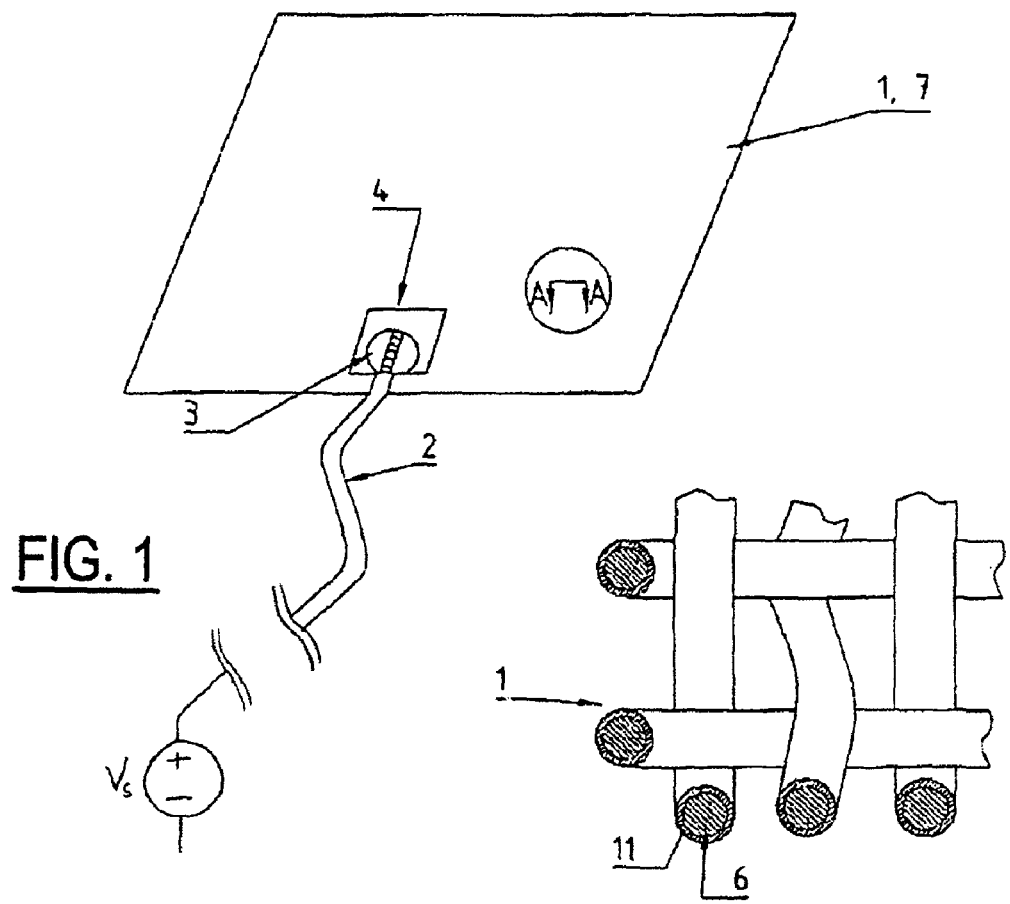
FIG. 1
FIG. 1A
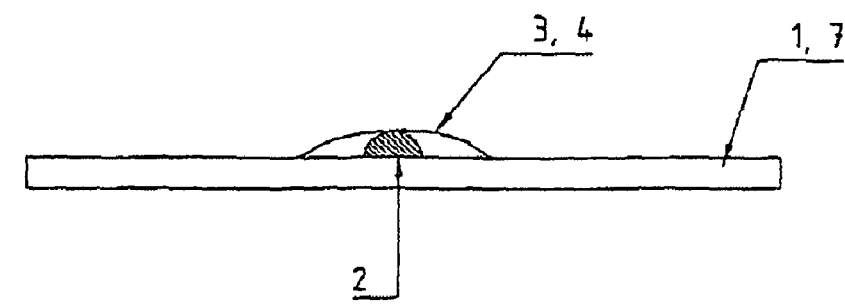
FIG. 2

ELECTRICALLY CONDUCTIVE TEXTILE

TECHNICAL FIELD

The present invention relates to an electrically conductive textile and, more particularly concerns a conductive textile suitable, for example, as an electric heating element, or for a vehicle seat-occupancy detection sensor.

BACKGROUND OF THE INVENTION

Electrically conductive textiles are usually brought into contact with electric cables or leads by means of crimping, sewing, or gluing. However, these attachment methods often cause a thickening at the contact point which is undesirable for some applications. Such attachment methods can also create potential fatigue or stress points which can diminish the robustness or durability of the conductive textile application.

A composite material is known from DE 199 26 379, in which strands capable of soldering can be jacketed with a binder made of solder. The unique nature of the composite material, however, substantially limits the material selection of the strands.

Various conductive textiles are also known. For example, "Electronic textiles: A platform for pervasive computing," MARCULESCU, Proceedings of the IEEE, Vol. 91, No. 12, December 2003, and "Enabling technologies for disappearing electronics in smart textiles," Jung et al., ISSCC 2003/Session 221TD: Embedded Technologies/Paper 22.1/2003 IEEE, disclose textiles with integrated metallic wires. The metallic wires act as the connection leads for electronic circuits embedded into the textiles. These metal strands are contacted by means of soldering. In the process, however, the textile carrier structure is destroyed in the surrounding area before or during the soldering process.

Other known heating elements have similar drawbacks in terms of contact attachment or limited material selection for the textile material. For example, DE 103 19 048 discloses a heating element made of carbon fibers or metal structures, in which soldering is disclosed as a technical possibility for joining the contacts. In this case, however, a limitation of the material selection also exists.

Metallic coatings applied on conductive textiles are often extremely thin, such as for reasons of costs, weight, or flexibility (i.e. smaller than 1 μm). In such a case, the conductive textiles can no longer be sufficiently contacted by means of a solder connection to insure the integrity of the material and durability of the connection.

Therefore, a demand exists for a reliable and flat connection method, the application possibility of which is not limited to massive metals.

SUMMARY OF THE INVENTION

The present invention provides an electrically conductive textile having a surface structure that is at least partially electrically conductively coated by a conductor coating and which is capable of being connected to an electric current or voltage source by way of at least one electrical connecting conductor. The connecting conductor is in contact at least electrically with a conductor coating at at least one solder point. The conductor coating is provided thicker at at least one contact zone in the area of the solder point as opposed to other areas of the surface structure.

In one embodiment, the surface structure contains metallized strands which can be made of synthetic material. The metallization serves as the conductor coating, and the surface structure can comprise essentially the same material.

In another embodiment, the solder point can also be glued such as, for example, by a hot glue process. The softening or melting temperature of the solder can be higher than that of the textile, particularly the metallized strands.

The surface structure can have a textile, film, netting or a combination thereof, which can be configured such that the conductor coating is applied at least onto parts or components of the surface structure.

The electrically conductive conductor coating can have a thickness of 5 μm to 1 mm in the contact zone. In one embodiment the conductor coating has a thickness of 10 μm to 20 μm in the contact zone, and a thickness of 0.1 μm to 10 μm in other areas. In another example, the conductor coating has a thickness of between 0.5 μm and 5 μm in other areas. The ratio of the conductor coating thickness in the contact zone can vary from 2 to 5 times as thick as the other areas of the surface structure.

One method of forming the inventive surface structure includes providing an electrically conductively coated surface structure such as metallized fabric. A contact zone is created in the region wherein it is desired to attach a connecting conductor. In one example, a thickened contact zone is provided by galvanizing the electrically conductively coating in the desired region. Thereafter, soldering the connecting conductor in the region of the contact zone results in a robust, flat, connection between the fabric and the connecting conductor. The robustness of the connection can be increased by additionally gluing the solder connection.

The present invention permits the soldering on of electrical conductors onto electrically conductively coated surface structures, even though it would typically be expected that, for example, a surface structure would be singed at soldering temperature. By way of the targeted, spatially limited reinforcement of the metallic coating within the connecting area of the conductive surface structure, i.e. by galvanizing processes, it is possible to create a stable solder connection in that area. In this manner, the present invention enables a flat, fatigue-endurable, robust connection.

Other objects and advantages will become apparent with reference to the following detailed description, taken in conjunction with the accompanying drawings.

BRIEF DESCRIPTION OF THE DRAWINGS

For a more complete understanding of this invention reference should now be had to the embodiments illustrated in greater detail in the accompanying figures and described below by way of examples of the invention wherein:

FIG. 1 is a top view of a surface structure with a connecting lead according to one embodiment of the present invention.

FIG. 1A is a detailed view of the surface structure in a longitudinal section.

FIG. 2 is a longitudinal section across the surface structure of FIG. 1.

DETAILED DESCRIPTION OF THE INVENTION

Figure 3:
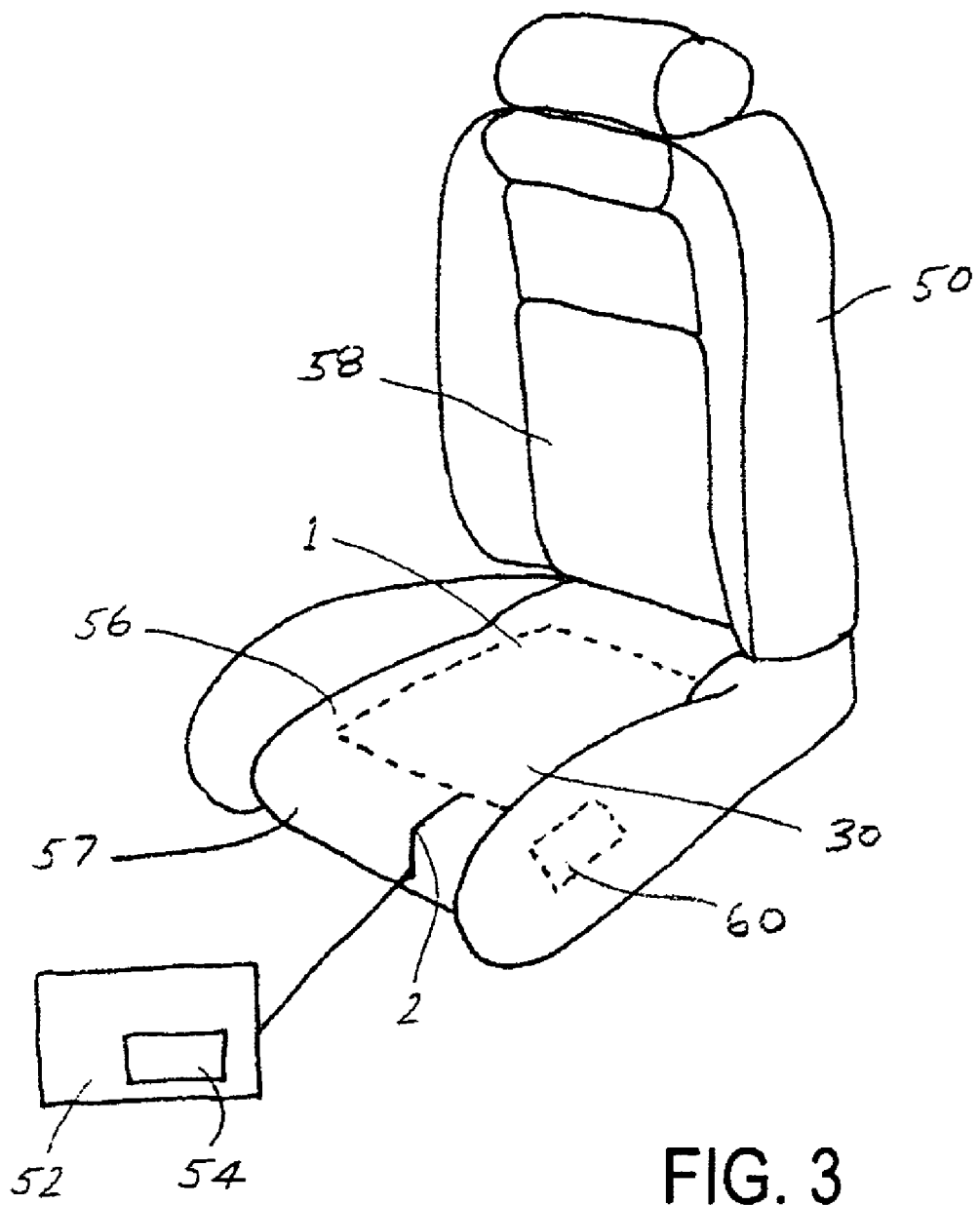
FIG. 3 is a perspective and block diagrammatic view of a vehicle seat incorporating a surface structure in accordance with an embodiment of the present invention.

In the following figures, the same reference numerals are used to refer to the same components. While the present invention is described as an electrically conductively coated surface structure which can be used as part of a heating element for use within a vehicle seating system, it may be adapted and applied to various systems including steering wheel systems or other vehicle or non-vehicle systems requiring a heated surface. It an also be used in any conductive textile application including vehicle seat occupancy detection sensors. In this regard, in the following description, various operating parameters and components are described for several constructed embodiments. These specific parameters and components are included as examples only and are not meant to be limiting.

FIGS. 1, 1A and 2 show an electrically conductively coated surface structure. In the present case it is a metallized fabric. For example, the fabric comprises non-conductive synthetic strands which can be made of polyamide. The synthetic strands have an electrically conductive coating, such as silver. Of course, other non-conductive synthetic strands, and other conductive coatings could be used.

The surface structure is connected to a voltage source (shown) or a current source (not shown) by way of a connecting conductor 2. The connecting conductor 2 contacts the surface structure 1 at a solder point 3. In this area 3 the connecting conductor is soldered onto the surface structure 1.

In order to improve the soldering capability of the surface structure 1, a contact zone 4 is created in the area of the desired soldering point 3. For this purpose, the conductive coating 11 of the surface structure 1 is thickened in the contact zone 4, or an additional, electrically conductive coating is applied. It may be the same material as the already existing electrically conductive conductor coating 11. Alternatively, the additional coating may be a different material. For example, a copper coating can be applied to a silver-plated conductor coating 11, which thickens the same. In addition or as alternative to copper-plating, however, silver-plating, or nickel-plating is also contemplated.

The thickening of the conductor coating 11 can be accomplished by, for example, galvanizing. In this process, the surface structure 1 is connected to a negative electric potential, for example. In the contact area 4, a suitable electrolyte fluid, such as a gel containing copper, is applied to a locally limited area, and connected to a positive electric potential. This causes a metal deposit on the surface structure 1, in particular, on the already existing conductor coating 11.

Additional coating may occur from one or both sides of the surface structure 1. Thus, an additional thickened contact zone 4 could be provide on the other side of the surface structure shown in FIG. 2.

Soldering is used to connect the conductor lead 2 to the contact zone 4. In one example, a tin-plated flexible wire is placed onto the surface structure in the region of the contact zone, and heated. The solder melts and penetrates the fabric. After cooling a firm connection between the flexible wire and the fabric is created. In order to increase the mechanical stability of the solder connection, an additional adhesion, such as gluing with a heated glue gun, may be provided.

The connecting conductor 2 can be a round conductor or a flat lead. Instead of pre-tin-plating, a soldering paste may also be used for connecting the flat conductor to the surface structure 1 in the region of the contact zone 4.

The surface structure, generally, may also be a knitted fabric, netting, a punched or slotted film, or a non-woven material. The metallic coating 11 can be achieved by way of electrically conductive synthetic materials or other metals, instead of silver. It is advantageous, though, if the melting temperature of the solder is higher than that of the textile, particularly the strands.

The connecting conductor 2 can also be provided in two parts. For example, a round conductor can be connected to a flat cable, i.e. by means of crimping. The flat cable, in turn, can be connected to the electrically conductive surface structure by means of soldering in the region of the contact area.

The contact zone 4 is thickened by, for example, galvanizing, such that it is approximately two to five times thicker than the other, non-thickened, areas 7 of the surface structure 1. For example, the electrically conductive conductor coating 11 may have a thickness of approximately 5 µm to 1 mm, at least in the contact zone 4. In one embodiment, the electrically conductive conductor coating 11 is approximately 10 µm to 20 µm in the area of the conductor zone. In the other areas 7 of the surface structure 1, the conductor coating 11 can be approximately 0.1 µm to 10 µm. In another embodiment, the conductor coating 11 is approximately 0.5 µm to 5 µm in the other areas 7 of the surface structure 1.

Referring now to FIG. 3, a perspective and block diagrammatic view of a vehicle seat 50 incorporating an electrically conductive surface structure 1 according to an embodiment of the present invention is shown. The surface structure 1 is electrically coupled to a controller 52 including a power source 54 by way of a connector which may be a contacting member 2 as described above. In this example, electrical power is transferred to the surface structure which acts as a heating element to warm an upper surface 56 of the seat cushion 57 of the seat 50. Of course, another surface structure 1 could be incorporated into the backrest 58 to similarly warm that portion of the seat 50 as well. As shown, the heating element is contained within a seat cover 30 and is beneath and near the upper surface 56 to provide efficient transfer of thermal energy for the heating element 1 to the upper surface 64. The heating element could also be incorporated into other portions of the seat cushion, and the seat system 50 could also include a fan or blower 60 electrically coupled to the controller 52 for directing air across the heating element towards the upper surface 56. A similar arrangement could also be included in the backrest 58.

The same arrangement as shown in FIG. 3 could also act as a seat occupancy detector. In such a case, the electrically conductive surface structure 1 can act as a variable capacitive sensor, with the controller 52 programmed to monitor the capacitance of the device to determine whether the seat 50 is occupied.

While the invention has been described in connection with one or more embodiments, it is to be understood that the specific mechanisms and techniques which have been described are merely illustrative of the principles of the invention, numerous modifications may be made to the apparatus described without departing from the spirit and scope of the invention as defined by the appended claims.

What is claimed is:

1. An apparatus comprising: a surface structure having a surrounding area which is at least partially electrically conductively coated by a conductor coating and which is adapted to be connected to a power source by at least one electric connecting conductor, the connecting conductor electrically contacting the conductor coating at a contact zone, wherein the conductor coating is approximately two to five times as thick in the contact zone as compared to the surrounding area of the surface structure.

2. An apparatus according to claim 1 wherein the surface structure comprises metallized strands and wherein the metallization comprises the conductor coating.

3. An apparatus according to claim 2 wherein the strands are non-conductive synthetic strands.

4. An apparatus according to claim 1 wherein the connecting conductor is a round or flat cable.

5. An apparatus according to claim 1 wherein the contact zone is formed by galvanizing a metal to the conductor coating.

6. An apparatus according to claim 5 wherein the galvanized metal is different than the conductor coating.

7. An apparatus according to claim 6 wherein the galvanized metal comprises copper and the conductor coating comprises silver.

8. An apparatus according to claim 1 wherein the connecting conductor is soldered to a portion of the contact zone.

9. An apparatus according to claim 8 wherein the connecting conductor is additionally glued to a portion of the contact zone.

10. An apparatus according to claim 1 wherein the surface structure comprises a textile, film, netting or a combination thereof and the conductor coating is applied to at least portions of the surface structure.

11. An apparatus according to claim 1 wherein the conductor coating has a thickness of approximately 5 μm to 1 mm in the contact zone, and a thickness of approximately 0.1 μm to 1 μm in the surrounding area.

12. An apparatus according to claim 1 wherein the conductor coating has a thickness of approximately 10 μm to 20 μm in the contact zone, and a thickness of approximately 0.5 μm to 5 μm in the surrounding area.

13. A method of electrically connecting a connecting conductor to a conductive textile comprising the steps of:
providing a surface structure which is at least partially electrically conductively coated by a conductor coating;
metallizing the conductor coating to form at least one contact zone which is approximately two to five times thicker than a surrounding area, of the surface structure; and
soldering the connecting conductor at least one point associated with the contact zone to establish an electrical connection between the connecting conductor and the surface structure.

14. A method according to claim 13 comprising the step of metallizing the conductor coating on both sides of surface structure to form at least one contact zone.

15. A method according to claim 13 comprising the step of gluing, the connecting conductor at the at least one contact point.

16. A method according to claim 13 wherein the step of metallizing comprises galvanizing the conductor coating.

17. A method according to claim 13 wherein the conductor coating has a thickness of approximately 5 μm to 1 mm in the contact zone, and a thickness of approximately 0.1 μm to 10 μm in the surrounding area.

18. An apparatus according to claim 1, comprising:
a core pad, wherein the surface structure overlays at least a portion of one side of the core pad; and
a seat cover overlaying the surface structure and coupling the surface structure to the core pad.

19. An apparatus according to claim 18 wherein the surface structure comprises a capacitive sensor or a heating element.

* * * * *